United States Patent
Dolgin et al.

(10) Patent No.: US 10,649,051 B2
(45) Date of Patent: May 12, 2020

(54) SYSTEM AND METHOD FOR DETECTION OF CHEMICALS USING FREQUENCY MODULATED NUCLEAR QUADRUPOLE RESONANCE SIGNALS

(71) Applicant: RAYTHEON COMPANY, Waltham, MA (US)

(72) Inventors: Benjamin P. Dolgin, Alexandria, VA (US); Thomas Lavedas, Dulles, VA (US); Joseph J. Fraundorfer, Bethesda, MD (US)

(73) Assignee: Raytheon Company, Waltham, MA (US)

( * ) Notice: Subject to any disclaimer, the term of this patent is extended or adjusted under 35 U.S.C. 154(b) by 218 days.

(21) Appl. No.: 15/851,620

(22) Filed: Dec. 21, 2017

(65) Prior Publication Data

US 2019/0195973 A1    Jun. 27, 2019

(51) Int. Cl.
*G01R 33/44* (2006.01)
*G01R 33/46* (2006.01)
*G01N 24/08* (2006.01)

(52) U.S. Cl.
CPC ......... *G01R 33/441* (2013.01); *G01N 24/084* (2013.01); *G01R 33/4608* (2013.01); *G01R 33/4616* (2013.01); *G01R 33/445* (2013.01); *G01R 33/446* (2013.01)

(58) Field of Classification Search
CPC ........ G01R 33/00; G01R 33/20; G01R 33/44; G01R 33/441; G01R 33/445; G01R 33/446; G01R 33/46; G01R 33/4608; G01R 33/4616; G01N 24/00; G01N 24/08; G01N 24/084

USPC .......... 324/300, 307, 309, 310, 311
See application file for complete search history.

(56) References Cited

U.S. PATENT DOCUMENTS

| 4,820,981 | A | * | 4/1989 | Bussiere | G01R 33/123 |
| | | | | | 324/222 |
| 5,168,224 | A | | 12/1992 | Maruizumi et al. | |
| 6,054,856 | A | | 4/2000 | Garroway et al. | |
| 6,420,872 | B1 | | 7/2002 | Garroway et al. | |
| 6,522,135 | B2 | | 2/2003 | Miller et al. | |

(Continued)

OTHER PUBLICATIONS

Suits, Bryan H., "Chapter 2: Nuclear Quadrupole Resonance Spectroscopy", Handbook of Applied Solid State Spectroscopy, 2006, pp. 65-96, ISBN: 978-0-387-32497-5.

(Continued)

*Primary Examiner* — Hoai-An D. Nguyen
(74) *Attorney, Agent, or Firm* — Lewis Roca Rothgerber Christie LLP (57) ABSTRACT

A system and method for detecting a nucleus of interest in a chemical using a nuclear quadrupole resonance transition. An excitation pulse is used to excite one or more nuclei of interest, if they present in a sample, to an excited state, the energy of which depends on the magnetic field in the sample. The magnetic field in the sample is modulated, after the end of the excitation pulse, while the nuclei of interest decay from the excited state, so that the radiation they emit is frequency modulated. The frequency modulation is detected in the emitted radiation. In some embodiments a DC magnetic field is applied to the sample, during the application of the excitation pulse, to tune the frequency of the transition being excited.

18 Claims, 5 Drawing Sheets

(56) References Cited

U.S. PATENT DOCUMENTS

| | | | |
|---|---|---|---|
| 6,900,633 B2 | 5/2005 | Sauer et al. | |
| 6,924,644 B2 | 8/2005 | Suits et al. | |
| 2005/0206382 A1* | 9/2005 | Laubacher | G01R 33/441 324/318 |
| 2006/0119357 A1* | 6/2006 | Alvarez | G01R 33/3657 324/311 |
| 2013/0187647 A1* | 7/2013 | Walsh | G01N 24/081 324/303 |
| 2015/0260812 A1* | 9/2015 | Drake | G01R 33/441 324/307 |
| 2016/0109478 A1* | 4/2016 | Saito | G01Q 60/52 850/47 |

OTHER PUBLICATIONS

Smith, et al., "Nuclear Quadrupole Resonance Studies of Boron-Chlorine Compounds. Part I. Boron Trichloride and the Phenylboron Chlorides", Journal of the Chemical Society A, Inorganic, Physical Theoretical, vol. 0 No. 0, 1971, (pp. 173-177).
International Search Report for corresponding International Application No. PCT/US2018/066609, filed Dec. 19, 2018, International Search Report dated Aug. 7, 2019 and dated Aug. 16, 2019 (4 pgs.).
Written Opinion of the International Searching Authority for corresponding International Application No. PCT/US2018/066609, filed Dec. 19, 2018, Written Opinion of the International Searching Authority dated Aug. 16, 2019 (6 pgs.).

* cited by examiner

SYSTEM AND METHOD FOR DETECTION OF CHEMICALS USING FREQUENCY MODULATED NUCLEAR QUADRUPOLE RESONANCE SIGNALS

GOVERNMENT LICENSE RIGHTS

This invention was made with U.S. Government support under contract No. W911QY-17-C-0003 awarded by the Department of Defense. The U.S. Government has certain rights in this invention.

FIELD

One or more aspects of embodiments according to the present invention relate to detection of chemicals, and more particularly to a system and method for detection of chemicals using frequency modulated nuclear quadrupole resonance signals.

BACKGROUND

Nuclear quadrupole resonance spectroscopy may be used to directly identify explosives, narcotics, and other solid chemicals in a controlled and shielded laboratory environment. Some chemicals may be difficult to detect, however, due to the diffused nature of the nuclear quadrupole resonance response. Moreover, the presence of ferromagnetic and piezoelectric materials in the sample may significantly increase the difficulty of performing such detections, because, for example, magnetic particle may ring and create false positives.

Thus, there is a need for an improved system and method for detection of chemicals using nuclear quadrupole resonance techniques.

SUMMARY

Aspects of embodiments of the present disclosure are directed toward a system and method for detecting a nucleus of interest in a chemical using a nuclear quadrupole resonance transition. An excitation pulse is used to excite one or more nuclei of interest, if they present in a sample, to an excited state, the energy of which depends on the magnetic field in the sample. The magnetic field in the sample is modulated, after the end of the excitation pulse, while the nuclei of interest decay from the excited state, so that the radiation they emit is frequency modulated. The frequency modulation is detected in the emitted radiation.

According to an embodiment of the present invention there is provided a method for detecting nuclear quadrupole resonance transitions, the method including: subjecting a sample to an electromagnetic excitation pulse; subjecting the sample to a modulating magnetic field, the modulating magnetic field being a time-varying magnetic field; and measuring a frequency modulation of an emitted signal, the emitted signal being an electromagnetic signal emitted from a nuclear quadrupole transition in the sample, the frequency modulation being proportional to the time-varying magnetic field.

In one embodiment, the electromagnetic excitation pulse has a duration of between 1 microsecond and 1 second.

In one embodiment, the modulating magnetic field is the sum of a constant component and a sinusoidally time-varying component.

In one embodiment, the sinusoidally time-varying component has a frequency between 100 Hz and 10 kHz.

In one embodiment, the sinusoidally time-varying component has an amplitude between 10 microteslas and 5000 microteslas.

In one embodiment, the method includes estimating an amplitude, in the measured frequency modulation, of a signal at twice the frequency of the sinusoidally time-varying component.

In one embodiment, the method includes subjecting the sample to a tuning field during the subjecting of the sample to the electromagnetic excitation pulse.

In one embodiment, the subjecting of the sample to a modulating magnetic field begins after the subjecting of the sample to the electromagnetic excitation pulse ends.

In one embodiment, the method includes correlating the measured frequency modulation with the magnitude of the modulating magnetic field.

According to an embodiment of the present invention there is provided a system for detecting nuclear quadrupole resonance transitions, the system including: a circuit for subjecting a sample to an electromagnetic excitation pulse; a circuit for subjecting the sample to a modulating magnetic field, the modulating magnetic field being a time-varying magnetic field; a sensor circuit for detecting an emitted signal, the emitted signal being an electromagnetic signal emitted from a nuclear quadrupole transition in the sample; and a processing circuit operatively coupled to the sensor circuit, the processing circuit being configured to measure a frequency modulation of the emitted signal, the frequency modulation being proportional to the time-varying magnetic field.

In one embodiment, the circuit for subjecting the sample to the electromagnetic excitation pulse includes a coil and a drive circuit for driving a current through the coil.

In one embodiment, the system includes a frequency modulation demodulator having an input and an output, the input of the frequency modulation demodulator being connected to the sensor circuit, and the output of the frequency modulation demodulator being connected to the processing circuit.

In one embodiment, the electromagnetic excitation pulse has a duration of between 1 microsecond and 1 second.

In one embodiment, the modulating magnetic field is the sum of a constant component and a sinusoidally time-varying component.

In one embodiment, the sinusoidally time-varying component has a frequency between 100 Hz and 10 kHz.

In one embodiment, the sinusoidally time-varying component has an amplitude between 10 microteslas and 5000 microteslas.

In one embodiment, the processing circuit is further configured to estimate an amplitude, in the measured frequency modulation, of a signal at twice the frequency of the sinusoidally time-varying component.

In one embodiment, the system includes subjecting the sample to a tuning field during the subjecting of the sample to the electromagnetic excitation pulse.

In one embodiment, the processing circuit is further configured to correlate the measured frequency modulation with the magnitude of the modulating magnetic field.

In one embodiment, the measuring of the frequency modulation of the emitted signal begins after the subjecting of the sample to the electromagnetic excitation pulse ends.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a system and method for detection of chemicals using frequency modulated nuclear quadrupole resonance signals provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
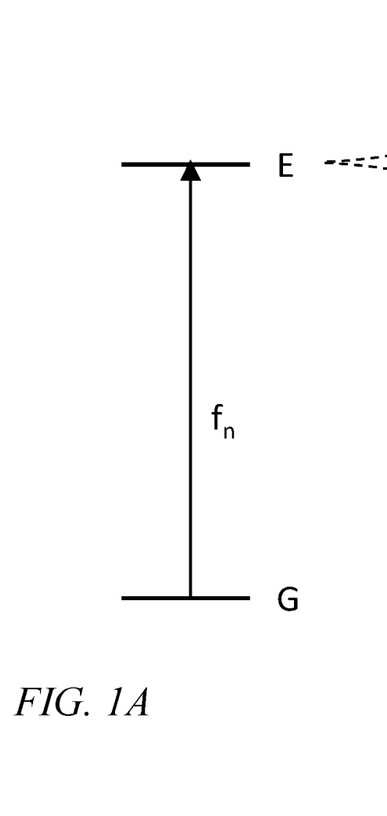
FIG. 1A is an energy level diagram, according to an embodiment of the present invention.
Figure 1B:
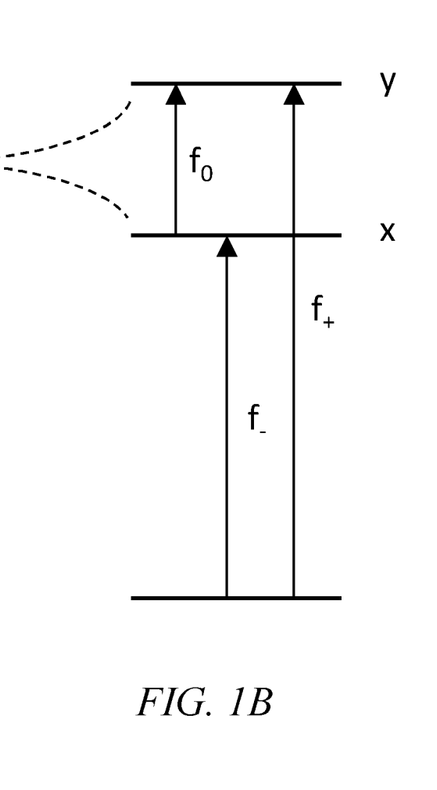
FIG. 1B is an energy level diagram, according to an embodiment of the present invention.

Referring to FIG. 1A, in some embodiments, a nucleus may have a plurality of energy eigenstates, including a ground state G and a first excited state E, separated by an energy corresponding to a frequency $f_n$ (i.e., the frequency being the energy difference divided by Planck's constant). The first excited state E may be degenerate and the nuclear charge distribution may have a nonzero quadrupole moment so that, in the presence of (and by an amount proportional to) an electric field gradient at the nucleus, the excited state may be split (as shown in FIG. 1B), into two "singly split" states separated by an energy corresponding to a frequency $f_0$, into a lower energy state x (with an energy corresponding to a frequency $f_-$) and a higher energy state y (with an energy corresponding to a frequency $f_+$). The terminology "singly split" is used herein to refer to the two states split as a result of the interaction between the electric field gradient and the nonzero quadrupole moment of the charge distribution, and to distinguish from the "doubly split" states described below. The energy difference between the lower energy state x and the higher energy state y may be proportional to the electric field gradient. If the nucleus is part of an atom that is part of a chemical compound, or otherwise a member of a bonded group of atoms, the electric field gradient may be the result the charge distributions of the other nuclei and of the electrons associated with the group. The frequency $f_+$, for example, may be a characteristic both of the chemical species and isotope of the nucleus (i.e., of its atomic number and atomic mass), which may determine $f_n$, and of the chemical environment of the atom, which may determine the electric field gradient and thereby the offset between $f_n$ and $f_+$. As such, a detection, in a sample, of a nuclear quadrupole resonance transition with a frequency $f_+$ (i.e., detecting a nuclear quadrupole resonance transition having an energy corresponding to the frequency $f_+$) may signal the presence, in the sample, of a particular chemical compound. Nitrogen, for example, when it is part of a explosive chemical compound, may have a certain nuclear quadrupole resonance transition energy and frequency, so that detecting, in a sample, a response at this frequency may signal the presence of an explosive in the sample. As used herein, a "nuclear quadrupole resonance transition" is a transition between two nuclear energy states at least one of which is shifted as a result of an interaction between an electric field gradient and a nonzero quadrupole moment of the nuclear charge distribution.

Figure 1C:
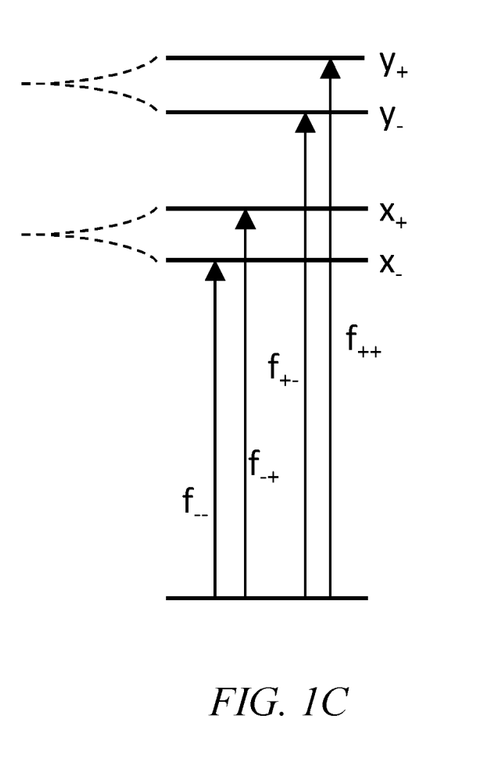
FIG. 1C is an energy level diagram, according to an embodiment of the present invention.

Each of the states x and y may be further degenerate, and, if the nucleus has a nonzero magnetic dipole moment, then both of these states may be further split, into four doubly split states $x_-$, $x_+$, $y_-$, and $y_+$, as shown in FIG. 1C, with frequencies $f_{--}$, $f_{-+}$, $f_{+-}$, and $f_{++}$, respectively. As used herein the "frequency" of a state refers to the frequency corresponding to the energy of the state (with respect to the ground state G, i.e., the frequency is equal to the energy divided by Planck's constant). The energy of any of these four states is a function of the magnetic field. This may render the detection of the response, at, for example, the frequency $f_+$, more difficult because the magnetic field within the sample may not be well known, may vary with position within the sample, and may be affected, for example, by the presence and location of ferromagnetic particles in the sample.

Figure 2A:
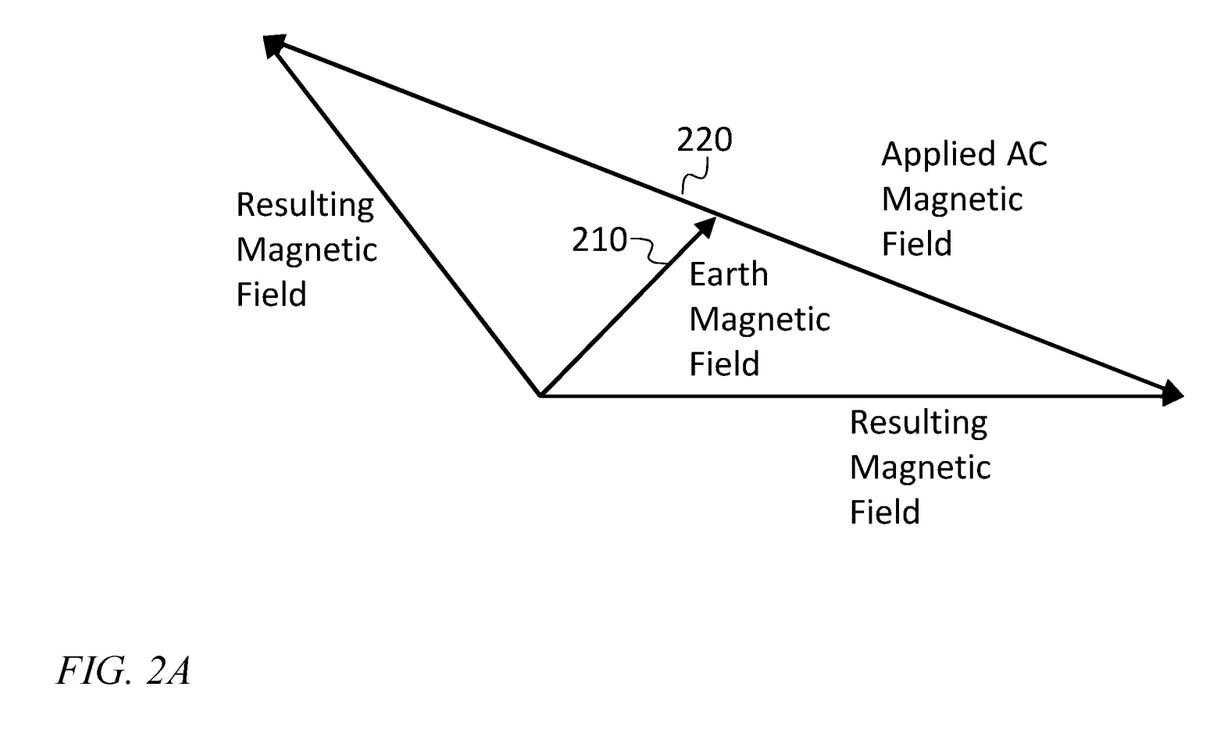
FIG. 2A is a field vector diagram, according to an embodiment of the present invention.

In some embodiments, to address this difficulty, a time-varying magnetic field is applied to the sample during the detection process. Referring to FIG. 2A, the applied magnetic field may include a constant (DC) component, e.g., a component due to the Earth's magnetic field, and an AC component (a time-varying component that lacks a DC component), that may for example be provided by a coil driven by an AC current. The AC component may have an amplitude that is large enough to result in an acceptable signal-to-noise ratio at the output of the system, while not being sufficiently large to require high drive currents or voltages. In some embodiments, the AC component has an amplitude between 10 microteslas and 5000 microteslas. If the DC component is given by a first vector 210, and the time-varying component is a sinusoidally time-varying component (i.e., it is equal to the product of a constant vector and a sinusoidal function of time), then the spectrum of the magnitude of the total field 220 may have a DC component and components at harmonics of the frequency of the sinusoidally time-varying component.

Figure 2B:
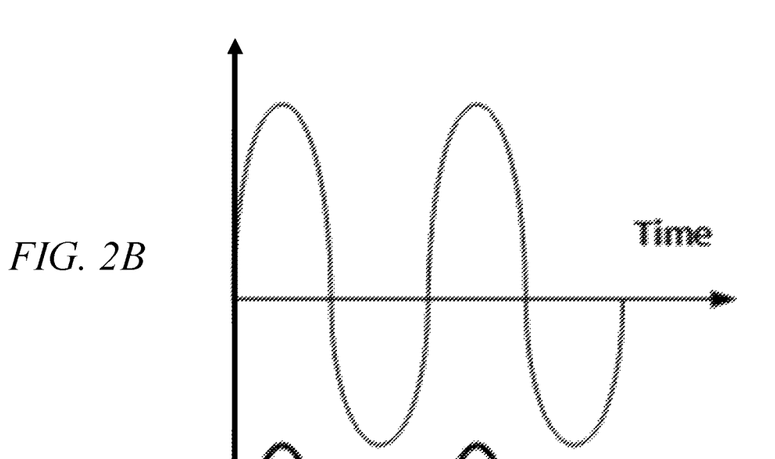
FIG. 2B is a graph of magnetic field as a function of time, according to an embodiment of the present invention.
Figure 2C:
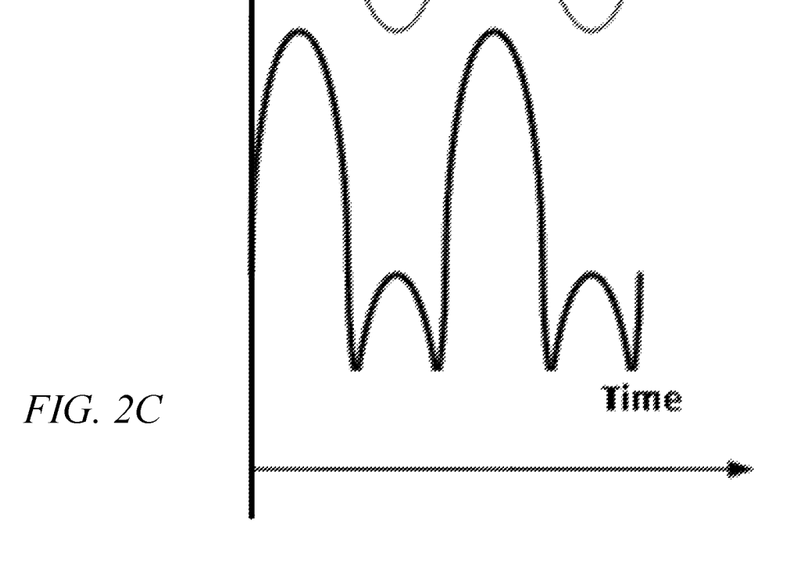
FIG. 2C is a graph of magnetic field magnitude as a function of time, according to an embodiment of the present invention.
Figure 2D:
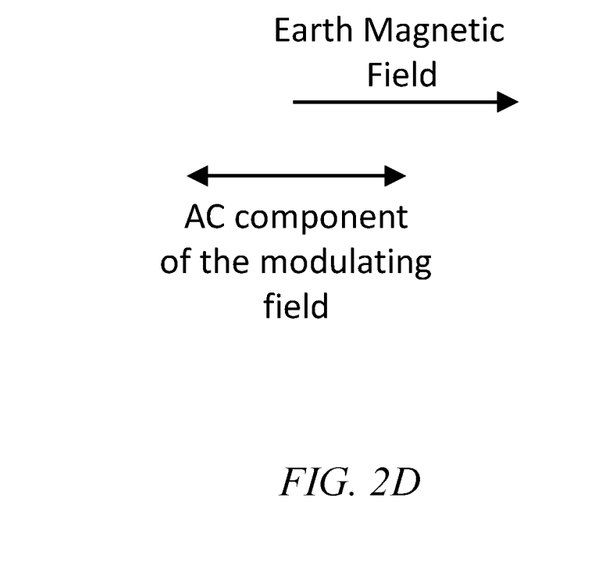
FIG. 2D is a field vector diagram, according to an embodiment of the present invention.
Figure 2E:
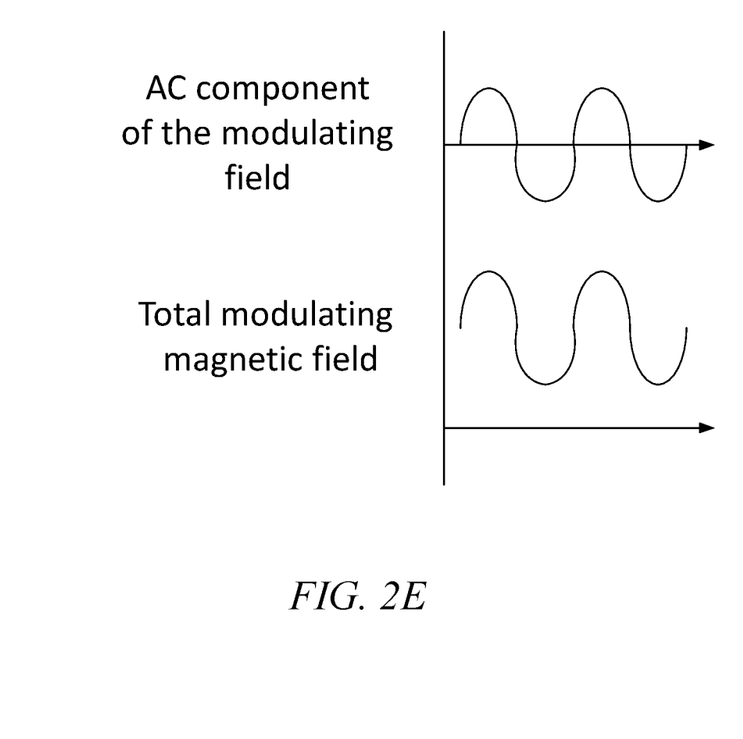
FIG. 2E is a graph of an AC component of a magnetic field, and a graph of magnetic field magnitude as a function of time, according to an embodiment of the present invention.

FIG. 2B shows a graph of a sinusoidal function of time, and FIG. 2C shows the magnitude of a total magnetic field, as a function of time, that may result when the total magnetic field consists of a DC component and the product of a constant vector and the sinusoidal function of time of FIG. 2B. It is apparent that the magnitude of the total magnetic field has a DC component and components at harmonics of the frequency of the sinusoidal function of time. The respective amplitudes of the harmonics may depend on various factors including the directions of the DC component of the magnetic field and of the AC component of the magnetic field, and their relative magnitudes. For example, if the DC component of the magnetic field is larger than the AC component and the two components are substantially parallel, (as illustrated, for example, in FIG. 2D), then it is expected that the spectrum of the magnitude of the modulating magnetic field (or "total modulating magnetic field") 220 may consist primarily of (i) a DC component and (ii) the first harmonic (i.e., a signal at the frequency of the sinusoidal function of time). If the DC component of the magnetic field is significantly larger than the AC component, then the waveform of the magnitude of the total field 220 may have the shape of a rectified sine wave and may consist primarily of even harmonics of the frequency of the sinusoidal function of time.

Figure 3:
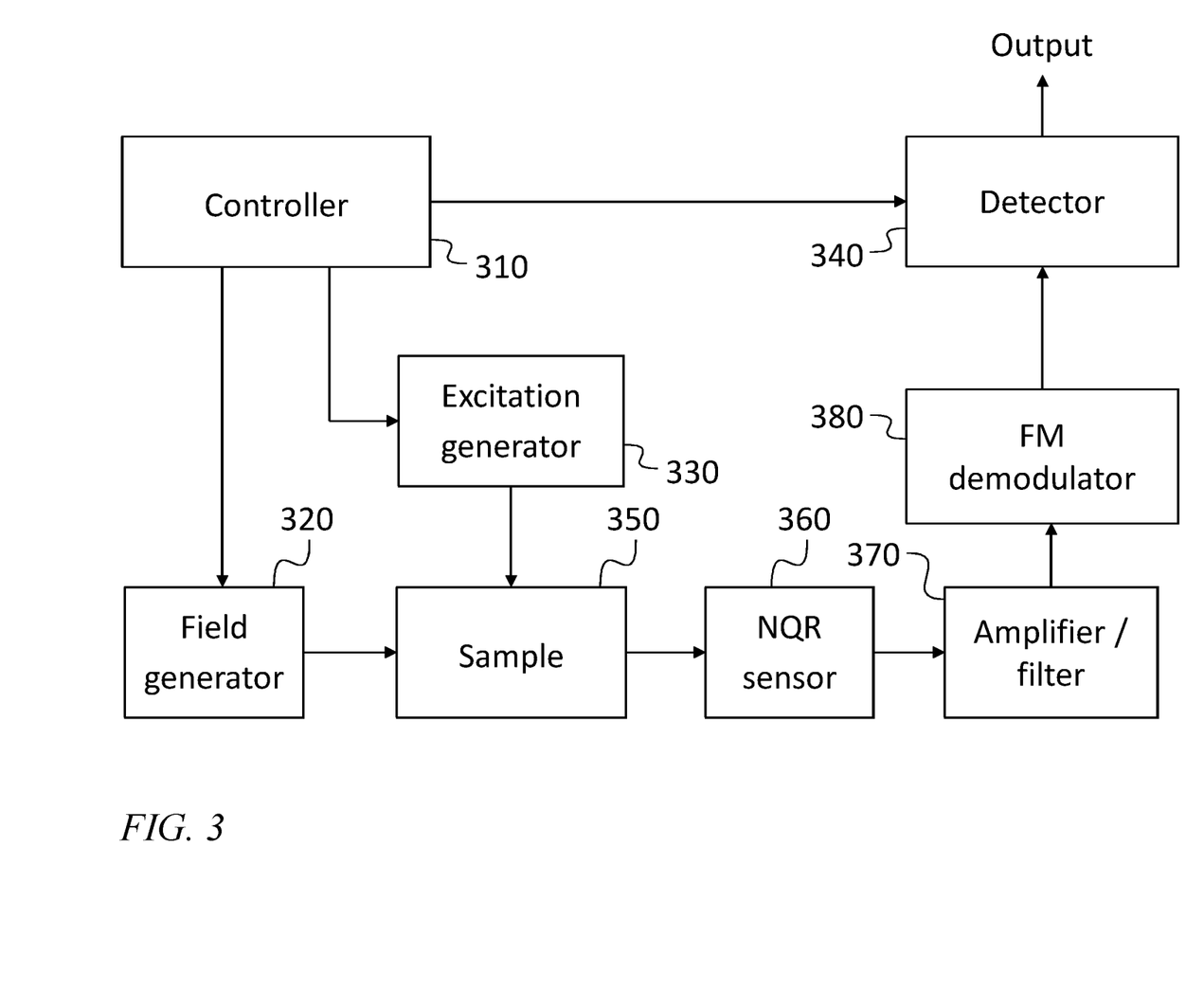
FIG. 3 is a block diagram of a system for the detection of chemicals, according to an embodiment of the present invention.

Referring to FIG. 3, an improved system for detection of chemicals using frequency modulated nuclear quadrupole resonance signals may be constructed as shown, based on the observations above. A controller 310, which may be a processing circuit as discussed in further detail below, may control a field generator 320, an excitation generator 330, and a detector 340. In operation, the controller 310 commands the excitation generator 330 to generate an electromagnetic excitation pulse, directed at the sample 350, the excitation pulse being at the frequency of one of the four doubly split states $x_-$, $x_+$, $y_-$, and $y_+$. Assuming for the purpose of illustration (and without loss of generality) that the electromagnetic excitation pulse is at the frequency $f_{++}$ of the highest one, $y_+$, of the four doubly split states, the effect of the electromagnetic excitation pulse may be to excite nuclei of interest in the sample 350 (e.g., nitrogen nuclei that are elements of explosive compounds) into the highest excited state (of the four doubly split states). Once the excitation pulse ends, these nuclei will then decay back to the ground state, emitting energy as electromagnetic radiation at the frequency $f_{++}$. The frequency of the excitation pulse may be selected to coincide, when the sample is in the Earth's magnetic field, with the frequency of the transition to be excited. In some embodiments, a DC magnetic field is applied at the same time as the excitation pulse (e.g., by the field generator 320, by the excitation generator 330, or by a separate tuning field generator (not shown in FIG. 1)), to provide a magnetic field in the sample that adjusts the frequency of interest to be equal to the frequency of the electromagnetic excitation pulse. The magnitude of the tuning field may be adjusted iteratively, e.g., by measuring the emitted radiation after a first electromagnetic excitation pulse, adjusting the tuning field in one direction (e.g., increasing it) by a small amount, measuring the emitted radiation after a second electromagnetic excitation pulse, and then adjusting the tuning field again in the same direction if the effect of the first adjustment is an increase in the emitted radiation, or adjusting the tuning field in the opposite direction (e.g., decreasing it) if the effect of the first adjustment is an decrease in the emitted radiation. This process may be employed, for example, if the temperature of the sample changes, because temperature may affect the frequencies $f_{--}$, $f_{-+}$, $f_{+-}$, and $f_{++}$.

After the end of the electromagnetic excitation pulse, a modulating magnetic field may be applied to the sample by the field generator 320, in response to a suitable command from the controller 310. Because the separation between the frequency of the excited state (e.g., the frequency $f_{++}$ of the highest one, $y_+$, of the four doubly split states) and the corresponding singly split state (x or y) is proportional to the magnitude of the modulating magnetic field (which includes the contributions, if any, from the Earth's magnetic field and from ferromagnetic components of the sample), the modulating magnetic field may modulate the frequency $f_{++}$ at which the excited nuclei radiate energy. The emitted electromagnetic radiation at the frequency $f_{++}$ may then be sensed by a nuclear quadrupole resonance sensor 360, amplified and filtered by an amplifying and filtering circuit 370, and converted, by a frequency modulation (FM) demodulator 380, to a signal proportional to the frequency of the emitted electromagnetic radiation.

The detector 340 may then analyze the output of the FM demodulator 380 for the presence of signals corresponding to those that the nuclei of interest are expected to emit. For example, if the DC component of the magnetic field is larger than the AC component and the two components are substantially parallel (as illustrated, for example, in FIG. 2D), then it is expected that the signal at the output of the FM demodulator 380 will contain a component at the frequency of the AC component of the modulating field. This is the case independent of the magnitude of the DC component of the modulating magnetic field, and of the magnitude of the AC component of the modulating magnetic field, provided the DC component of the modulating magnetic is large relative to, and substantially parallel to, the AC component of the modulating field. As such, it is not necessary for the modulating magnetic field to be spatially uniform.

The detector 340 may be a processing circuit as discussed in further detail below, and it may receive digital signals from the controller 310 and from the FM demodulator 380. In some embodiments the detector 340 includes a processing circuit and one or more analog to digital converters, and the detector 340 receives one or more analog signals from the controller 310 and from the FM demodulator 380.

Similarly, even if the DC component of the modulating magnetic field is not large relative to, or not substantially parallel to, the AC component of the modulating field, it may be possible to detect, in the electromagnetic radiation emitted by the sample after the electromagnetic excitation pulse, the signature of the nuclei of interest from the spectral content of the emitted electromagnetic radiation. For example, the emitted electromagnetic radiation may be fit to a predicted shape, or waveform (such as that of FIG. 2C), based on the known modulating magnetic field (the DC component of which may be known from knowledge of the Earth's magnetic field, or from a measurement performed, for example, with a magnetometer). The extent to which a waveform having the predicted shape is present in the emitted electromagnetic radiation may then be used to infer the extent to which nuclei of interest are present in the sample. The fitting may include correlating the measured frequency modulation with the magnitude of the modulating magnetic field. The correlating may be performed by sampling the measured frequency modulation (e.g., the output of the output of the FM demodulator 380) to obtain a digital time record (the time record being a list (e.g., an array) of digital values, each corresponding to the value of the frequency modulation at a corresponding point in time (i.e., at the sampling time)), and then multiplying, pointwise, the time record of the measured frequency modulation with a time record of the modulating magnetic field (which may be generated digitally, by adding the known or measured DC component of the modulating magnetic field to an array of the values of the commanded AC component of the modulating magnetic field), and taking the average or the sum of the pointwise product that results from the pointwise multiplication.

For example, for relative directions and amplitudes such as those illustrated in FIG. 2A, the dominant spectral component of the signal at the output of the FM demodulator 380 may not be at the first harmonic (i.e., at the frequency of the AC component of the modulating magnetic field) but the signal at the output of the FM demodulator 380 may be expected, nonetheless, to include signals at harmonics of the frequency of the AC component of the modulating magnetic field, and it may be expected that these signals will be phase-coherent with the AC component of the modulating magnetic field.

As such, the detector 340 may be able to detect the presence of nuclei of interest by detecting one or more of these harmonics, for example by mixing the signal received from the FM demodulator 380 with these harmonics. The detector 340 may receive, from the controller 310, a signal proportional to the AC component of the modulating magnetic field, and it may generate, e.g., using suitable digital operations, harmonics of the AC component of the modulating magnetic field. The detector 340 may then test for the presence of any harmonic of the AC component of the modulating magnetic field by multiplying the signal from the FM demodulator 380 by the harmonic, in the time domain, and filtering the resulting product with a low-pass filter.

The excitation generator 330 may be a circuit that includes (i) a drive circuit for generating an excitation pulse drive current and (ii) an antenna for converting the current to electromagnetic waves, directed at the sample. The drive circuit of the excitation generator 330 may include a power amplifier, and, if the input to the excitation generator 330 is a digital input, a digital to analog converter. The field generator 320 may similarly be a circuit that includes include a (i) drive circuit for generating a drive current for the modulating magnetic field, and (ii) a coil for converting the current to a magnetic field, the magnetic field extending into the sample. The respective drive circuits of the excitation generator 330 and the field generator 320 may differ in the frequency ranges for which they are suited. For example, the electromagnetic excitation pulse may have a frequency of about 1 MHz (in some embodiments the frequency may be between 400 kHz and 10 MHz, or, in one embodiment, about 890 kHz) and the modulating magnetic field may have an AC component of about 1 kHz (in some embodiments the frequency may be between 100 Hz and 100 kHz). Similarly, although the structure employed to convert the drive current for the modulating magnetic field to the modulating magnetic field is referred to as a "coil" and the structure employed to convert the drive current for the excitation pulse to electromagnetic waves is referred to as an "antenna", the two structures need not be different, and, for example, each of these structures may be a coil. In some embodiments, the antenna for applying the electromagnetic excitation pulse is the same coil as the coil for applying the modulating magnetic field, and each of the two drive currents supplies a respective current to the coil. The drive circuit may also be shared, and it may produce both a high-frequency current (and a tuning current, if one is used) and the current for applying the modulating magnetic field.

The nuclear quadrupole resonance sensor 360 may similarly include an antenna (e.g., a coil) for converting the electromagnetic signal emitted from the sample to an electrical signal, and a circuit, including one or more amplifiers and filters, for amplifying and filtering the electrical signal. In some embodiments the nuclear quadrupole resonance sensor 360 may also include a frequency conversion circuit, such as a mixer connected to a local oscillator, which may mix the electrical signal down (or up) to an intermediate frequency for further amplification.

The FM demodulator 380 may be any suitable circuit for generating, at its output, a signal proportional to the frequency of a signal at its input. In some embodiments the FM demodulator 380 includes a filter that has a sloped frequency response over the range of frequencies it is expected to receive, and the output of the filter is connected to a power detector. In such a demodulator, assuming that the amplitude of the input signal is constant, if the slope of the sloped frequency response is positive, then as the frequency of the input signal increases, the amplitude of the filter output increases, and the signal at the output of the power detector increases also.

It will be understood that any of the four doubly split states $x_-$, $x_+$, $y_-$, and $y_+$ may be used to detect nuclei of interest, in a manner analogous to that described herein for the state $y_+$. It will further be understood that the modulating magnetic field need not consist of a DC component and a sinusoidal component, but in general may be any time-varying field resulting in detectable frequency modulation of the emitted electromagnetic radiation. For example, the waveform of the AC component, instead of being a sine wave, may be a triangle wave, or a saw-tooth waveform, or a square wave.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

Although limited embodiments of a system and method for detection of chemicals using frequency modulated nuclear quadrupole resonance signals have been specifically described and illustrated herein, many modifications and variations will be apparent to those skilled in the art. Accordingly, it is to be understood that a system and method for detection of chemicals using frequency modulated nuclear quadrupole resonance signals employed according to principles of this invention may be embodied other than as specifically described herein. The invention is also defined in the following claims, and equivalents thereof.

What is claimed is:

1. A method for detecting nuclear quadrupole resonance transitions, the method comprising:
    subjecting a sample to an electromagnetic excitation pulse;
    subjecting the sample to a modulating magnetic field, the modulating magnetic field being a time-varying magnetic field;
    measuring a frequency modulation of an emitted signal, the emitted signal being an electromagnetic signal emitted from a nuclear quadrupole transition in the sample, the frequency modulation being proportional to the time-varying magnetic field; and
    correlating the measured frequency modulation with the magnitude of the modulating magnetic field.

2. The method of claim 1, wherein the electromagnetic excitation pulse has a duration of between 1 microsecond and 1 second.

3. The method of claim 1, wherein the modulating magnetic field is the sum of a constant component and a sinusoidally time-varying component.

4. The method of claim 3, wherein the sinusoidally time-varying component has a frequency between 100 Hz and 10 kHz.

5. The method of claim 4, wherein the sinusoidally time-varying component has an amplitude between 10 microteslas and 5000 microteslas.

6. The method of claim 3, further comprising estimating an amplitude, in the measured frequency modulation, of a signal at twice the frequency of the sinusoidally time-varying component.

7. The method of claim 1, further comprising subjecting the sample to a tuning field during the subjecting of the sample to the electromagnetic excitation pulse.

8. The method of claim 1, wherein the subjecting of the sample to a modulating magnetic field begins after the subjecting of the sample to the electromagnetic excitation pulse ends.

9. A system for detecting nuclear quadrupole resonance transitions, the system comprising:
a first circuit for subjecting a sample to an electromagnetic excitation pulse;
a second circuit for subjecting the sample to a modulating magnetic field, the modulating magnetic field being a time-varying magnetic field;
a sensor circuit for detecting an emitted signal, the emitted signal being an electromagnetic signal emitted from a nuclear quadrupole transition in the sample; and
a processing circuit operatively coupled to the sensor circuit, the processing circuit being configured to measure a frequency modulation of the emitted signal, the frequency modulation being proportional to the time-varying magnetic field,
wherein the processing circuit is further configured to correlate the measured frequency modulation with the magnitude of the modulating magnetic field.

10. The system of claim 9, wherein the measuring of the frequency modulation of the emitted signal begins after the subjecting of the sample to the electromagnetic excitation pulse ends.

11. The system of claim 9, wherein the first circuit for subjecting the sample to the electromagnetic excitation pulse comprises a coil and a drive circuit for driving a current through the coil.

12. The system of claim 9, further comprising a frequency modulation demodulator having an input and an output, the input of the frequency modulation demodulator being connected to the sensor circuit, and the output of the frequency modulation demodulator being connected to the processing circuit.

13. The system of claim 9, wherein the electromagnetic excitation pulse has a duration of between 1 microsecond and 1 second.

14. The system of claim 9, wherein the modulating magnetic field is the sum of a constant component and a sinusoidally time-varying component.

15. The system of claim 14, wherein the sinusoidally time-varying component has a frequency between 100 Hz and 10 kHz.

16. The system of claim 15, wherein the sinusoidally time-varying component has an amplitude between 10 microteslas and 5000 microteslas.

17. The system of claim 14, wherein the processing circuit is further configured to estimate an amplitude, in the measured frequency modulation, of a signal at twice the frequency of the sinusoidally time-varying component.

18. The system of claim 9, further comprising subjecting the sample to a tuning field during the subjecting of the sample to the electromagnetic excitation pulse.

* * * * *